(12) United States Patent
Caimi et al.

(10) Patent No.: US 9,564,452 B1
(45) Date of Patent: Feb. 7, 2017

(54) FABRICATION OF HYBRID SEMICONDUCTOR CIRCUITS

(71) Applicant: International Business Machines Corporation, Armonk, NY (US)

(72) Inventors: Daniele Caimi, Rueschlikon (DE); Lukas Czornomaz, Rueschlikon (DE); Veeresh Vidyadhar Deshpande, Rueschlikon (DE); Vladimir Djara, Rueschlikon (DE); Jean Fompeyrine, Rueschlikon (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/011,765

(22) Filed: Feb. 1, 2016

(51) Int. Cl.
| | |
|---|---|
| H01L 29/745 | (2006.01) |
| H01L 29/768 | (2006.01) |
| H01L 21/8238 | (2006.01) |
| H01L 27/12 | (2006.01) |
| H01L 29/786 | (2006.01) |
| H01L 29/78 | (2006.01) |
| H01L 23/522 | (2006.01) |
| H01L 21/8234 | (2006.01) |
| H01L 21/84 | (2006.01) |

(52) U.S. Cl.
CPC ... *H01L 27/1207* (2013.01); *H01L 21/823412* (2013.01); *H01L 21/823475* (2013.01); *H01L 21/84* (2013.01); *H01L 23/5226* (2013.01); *H01L 29/7849* (2013.01); *H01L 29/78681* (2013.01); *H01L 29/78684* (2013.01)

(58) Field of Classification Search
CPC .............. H01L 21/823412; H01L 21/823475; H01L 21/84; H01L 29/78681; H01L 29/78684; H01L 29/7849
See application file for complete search history.

(56) References Cited

U.S. PATENT DOCUMENTS

| | | |
|---|---|---|
| 8,173,551 B2 | 5/2012 | Bai et al. |
| 8,384,196 B2 | 2/2013 | Cheng et al. |
| 2013/0161746 A1* | 6/2013 | Posseme ........... H01L 29/78696 257/347 |

* cited by examiner

*Primary Examiner* — Hsien Ming Lee
(74) *Attorney, Agent, or Firm* — Harrington & Smith

(57) ABSTRACT

A method is disclosed for fabricating a semiconductor circuit. A semiconductor substrate is provided. A first semiconductor device is fabricated including a first semiconductor material on the substrate and forming an insulating layer including a cavity structure on the first semiconductor device. The cavity structure includes at least one growth channel and the growth channel connects a crystalline seed surface of the first semiconductor device with an opening. Further steps include growing via the opening from the seed surface a semiconductor filling structure including a second semiconductor material different from the first semiconductor material in the growth channel, forming a semiconductor starting structure for a second semiconductor device from the filling structure, and fabricating a second semiconductor device including the starting structure. Corresponding semiconductor circuits are also disclosed.

24 Claims, 10 Drawing Sheets

700

1000

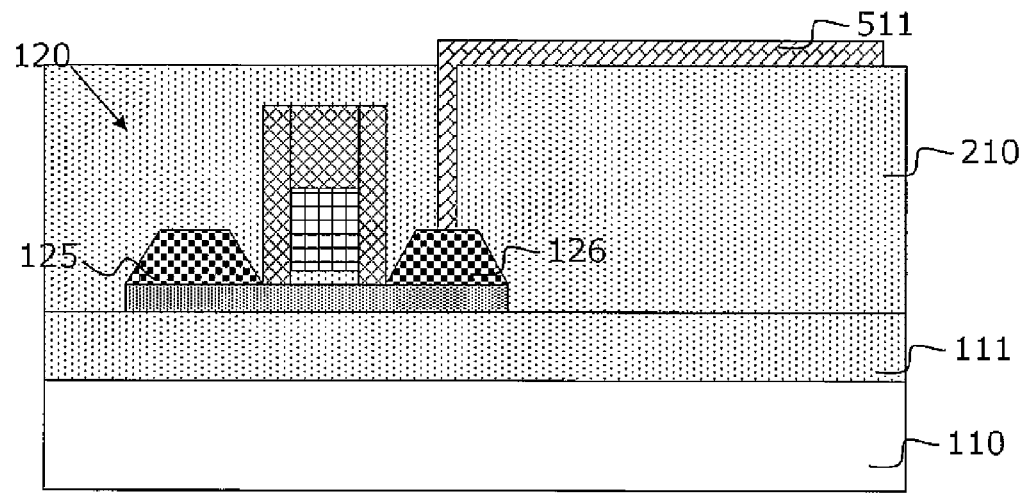
FIG. 5          500
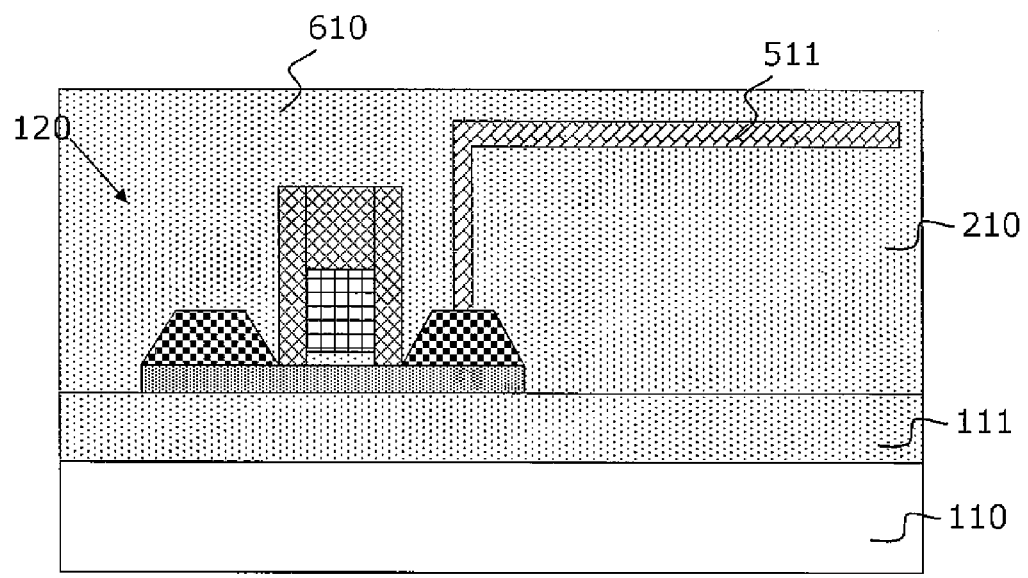
FIG. 6          600

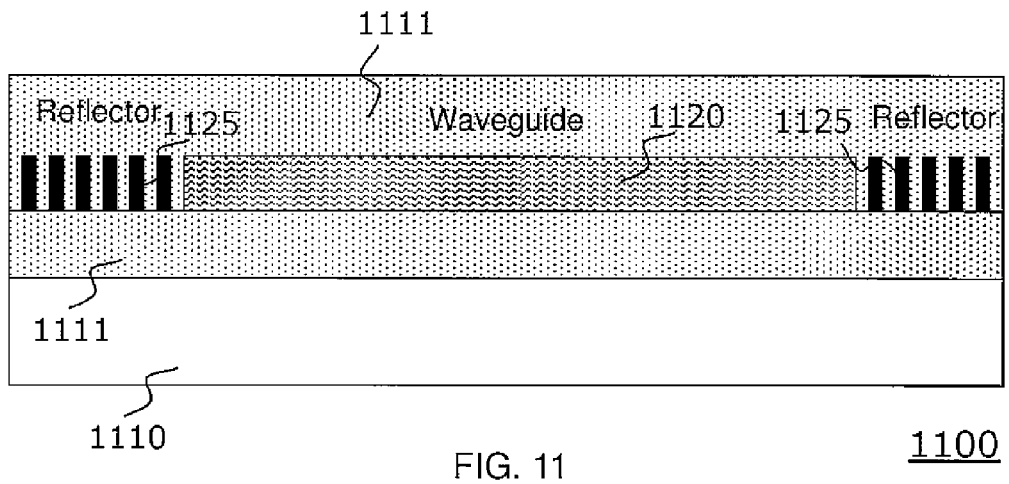
FIG. 11      1100
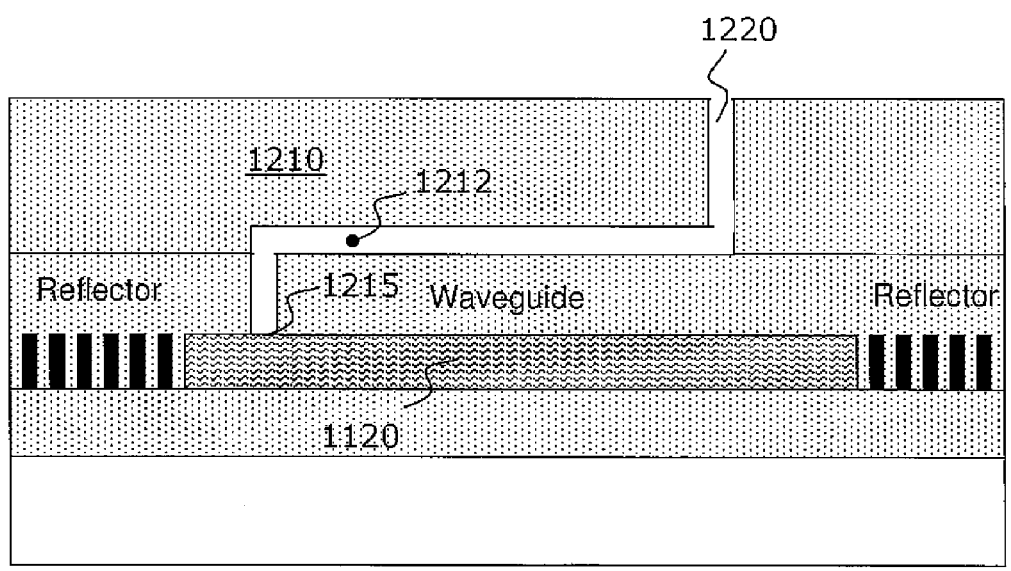
FIG. 12      1200

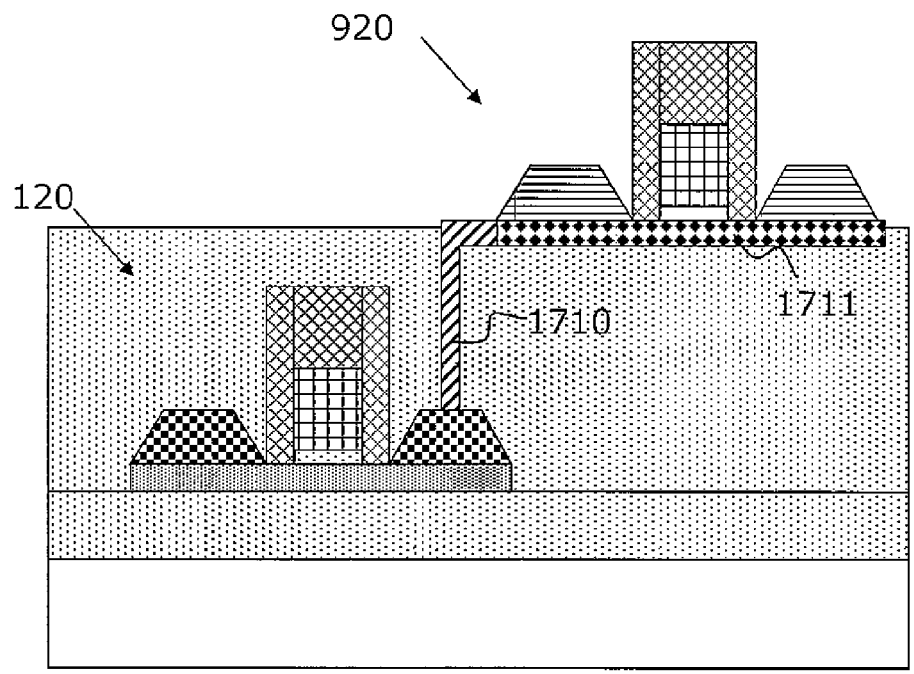
FIG. 17    1700
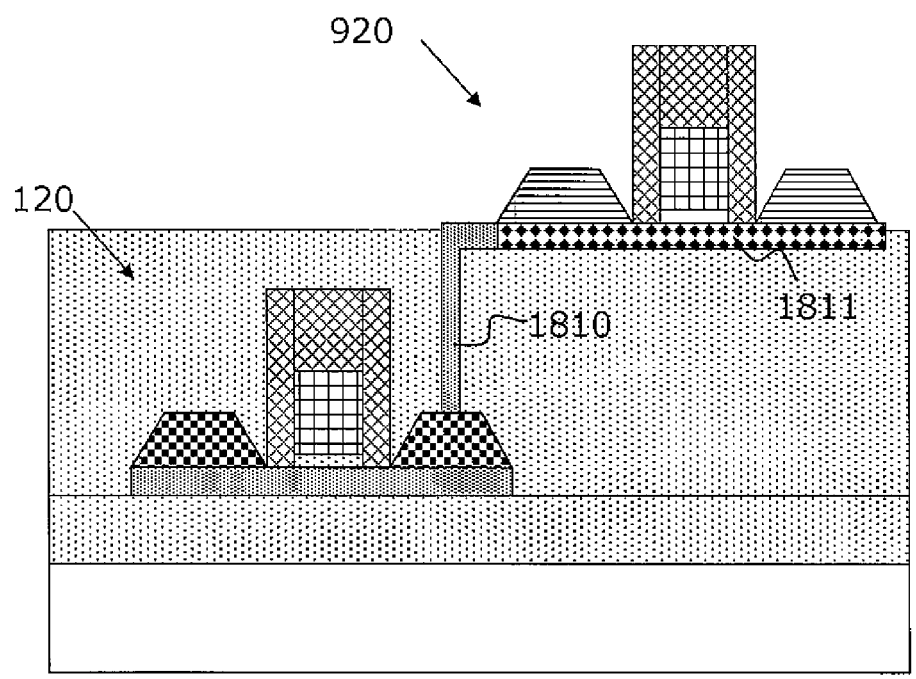
FIG. 18    1800

FABRICATION OF HYBRID SEMICONDUCTOR CIRCUITS

BACKGROUND

Embodiments of the invention relate generally to the fabrication of semiconductor circuits and more particularly to the fabrication of hybrid semiconductor circuits comprising semiconductor devices with different semiconductor materials.

Silicon is the basic material for present solid-state electronics, and processing techniques have evolved for decades. Hence, most electronic integrated circuit devices are based on silicon.

However, III-V compound semiconductors, and especially InGaAs, are being considered as a potential alternative for replacing strained Si in the channel of future nFETs due to their remarkable electron mobility. Moreover, some III-V compound semiconductors present several advantages for opto-electronics applications when compared to Si.

A monolithic integration of compound semiconductors on silicon wafers is desirable and has extensively been investigated in the past. Several problems need to be overcome when compound semiconductors and conventional silicon technologies are combined. First, there is a large lattice mismatch between a crystalline silicon substrate and most compound semiconductor crystals. Further, there is a thermal expansion coefficient mismatch between the (silicon) wafer material and the active compound semiconductor material. Additionally, a structural mismatch between diamond-like structures and zincblende structures may occur. It is an overall goal to achieve high crystalline quality over various monolithic layers for compound semiconductor on a foreign substrate such as silicon.

In an effort to achieve high crystalline quality in crystalline material layers that show a lattice mismatch, several methods have been developed. For example, direct epitaxy of blanket layers allow for a gradual transition from one lattice parameter to the next. However, relatively thick transition layers are needed to reduce the defect density considerably.

Techniques to combine compound semiconductor materials with conventional silicon wafers include bonding techniques. In direct wafer bonding, a compound hetero structure is fabricated on a donor wafer wherein the donor wafer material is eliminated after bonding with the conventional silicon wafer. This makes the bonding technology relatively expensive. Further, bonding is limited to the size of costly compound substrate wafers.

Another approach for combining lattice-mismatched materials such as compound semiconductors with silicon substrates is the aspect ratio trapping approach. Aspect ratio trapping (ART) refers to a technique where crystalline defects are terminated at non-crystalline, for example dielectric, sidewalls.

It is desirable to provide improved fabrication methods for hybrid semiconductor circuits. In particular, techniques to integrate compound semiconductors such as III-V semiconductors on common Si substrates would be highly desirable.

SUMMARY

According to a first aspect, an exemplary embodiment is embodied as a method for fabricating a semiconductor circuit. The method comprises providing a semiconductor substrate and fabricating a first semiconductor device comprising a first semiconductor material on the substrate. The method further comprises forming an insulating layer comprising a cavity structure on the first semiconductor device. The cavity structure comprises at least one growth channel, the growth channel connecting a seed surface of the first semiconductor device with an opening. Further steps comprise growing via the opening from the seed surface a semiconductor filling structure comprising a second semiconductor material different from the first semiconductor material in the growth channel, forming a semiconductor starting structure for a second semiconductor device from the filling structure and fabricating a second semiconductor device comprising the starting structure.

According to another aspect, and exemplary embodiment is embodied as a semiconductor circuit comprising a semiconductor substrate, a first semiconductor device comprising a first semiconductor material and a second semiconductor device comprising a second semiconductor material different from the first semiconductor material. An insulating layer is provided between the first semiconductor device and the second semiconductor device. The insulating layer comprises a cavity structure having at least one growth channel and the growth channel connects a seed surface of the first semiconductor device with a starting structure of the second semiconductor device. The starting structure comprises the second semiconductor material and is epitaxially grown from the seed surface of the first semiconductor device. The seed surface may be embodied as a crystalline seed surface.

Embodiments of the invention will be described in more detail below, by way of illustrative and non-limiting examples, with reference to the accompanying drawings.

BRIEF DESCRIPTION OF THE SEVERAL VIEWS OF THE DRAWINGS

FIGS. 1-20 show cross sectional views of successive stages of methods for fabricating semiconductor circuits according to embodiments of the invention.

FIG. 1 shows a cross sectional view of an initial structure comprising a silicon-on insulator substrate with a FET as first semiconductor device;

FIG. 2 shows a cross-sectional view of a structure after an insulating layer has been deposited as interlayer dielectric on the first semiconductor device;

FIG. 3 shows a cross-sectional view of a structure after a contact hole/channel has been formed in the insulating layer;

FIG. 4 shows a cross-sectional view of a structure after the deposition of a sacrificial material to form a sacrificial structure;

FIG. 5 shows a cross-sectional view of a structure after the sacrificial structure has been patterned and etched;

FIG. 6 shows a cross-sectional view of a structure after another insulating layer has been deposited as another interlayer dielectric on the sacrificial structure;

FIG. 7 shows a cross-sectional view of a structure after the removal of the sacrificial structure which has formed a cavity structure;

FIG. 8 shows a cross-sectional view of a structure after growing via an opening a semiconductor filling structure in a growth channel of the cavity structure;

FIG. 9 shows a cross-sectional view of a structure after a semiconductor starting structure has been formed;

FIG. 10 shows a structure after the fabrication of a second semiconductor device;

FIG. 11 illustrates a cross-sectional view of a waveguide structure as first semiconductor device;

FIG. 12 shows a cross-sectional view of a structure after a cavity structure has been formed on the first semiconductor device;

FIG. 13 shows the structure of FIG. 12 after growing a semiconductor filling structure in a growth channel of the cavity structure;

FIG. 14 shows a cross-sectional view of a structure after a semiconductor starting structure has been formed;

FIG. 15 shows a cross-sectional view of a structure after the fabrication of a III-V laser as second semiconductor device on the starting structure;

FIG. 16 shows a cross-sectional view illustrating how light is coupled between the waveguide structure and the III-V laser;

FIG. 17 shows a cross-sectional view of a structure corresponding to the structure of FIG. 10 and illustrating how a part of the filling structure may be formed as interconnect structure between the first semiconductor device and the second semiconductor device;

FIG. 18 shows a cross-sectional view of a structure which comprises a first filling structure of a third semiconductor material grown in a first growth step in the cavity structure;

FIG. 19 shows a cross-sectional view of a structure which was fabricated subsequently from the structure of FIG. 18 and comprises an interconnect structure of metal which has replaced the third semiconductor material; and FIG. 20 shows a cross-sectional view of a structure that comprises as further contact structures drain/source contacts.

DETAILED DESCRIPTION

Figure 1:
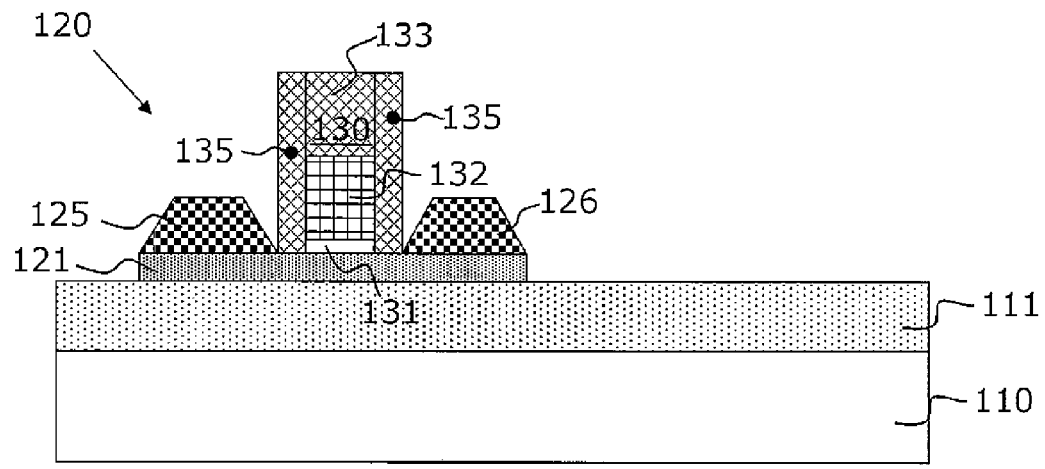

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As described above, a first aspect includes a method and a second aspect includes a semiconductor circuit. Additional examples that refer to the first and second aspects are now described.

Methods according to embodiments of the first aspect may facilitate an efficient and precise fabrication of hybrid semiconductor circuits. The semiconductor circuits may comprise semiconductor devices having different semiconductor materials. According to embodiments the first semiconductor structure is fabricated first and a surface of the first semiconductor device is used as seed surface to grow a filling structure in a cavity structure. In this respect, embodiments allow aligning the second semiconductor device to the first semiconductor device. Furthermore, fabrication processes may be adapted and optimized respectively for the different semiconductor materials, e.g. in terms of thermal budget. Furthermore, various new fabrication models may be facilitated. The seed surface may be embodied as a crystalline seed surface.

According to one embodiment, the first semiconductor material is comprised of $Si_xGe_{1-x}$ where x=0 to 1. This allows use of a plurality of well-known and established fabrication processes and methods.

According to another embodiment, the second semiconductor material is comprised of a group III-V compound material. Such III-V compound materials provide a very high electron mobility. The second semiconductor devices comprising III-V compound materials may be e.g. analog/RF Field Effect Transistors (FETs) or Fin/planar FETs for CMOS applications or photonic devices such as lasers or detectors.

According to an embodiment, the starting structure is an active layer of the second semiconductor device. Such an active layer may also be denoted as functional layer as it is involved in the functional behavior of the second semiconductor device. In this respect an active layer is opposed to passive components/layers of the second semiconductor device such as a substrate, substrate layer or bulk substrate which provide only mechanical/fabrication support, but are not actively involved in the function of the second semiconductor device. According to an embodiment, the second semiconductor device may be a Field Effect Transistors (FET) and the starting structure is a channel structure of the FET. In this embodiment, the channel structure is an active layer of the FET.

According to a further embodiment, the first semiconductor device is a Field Effect Transistors (FET) and the seed surface is a source and/or drain surface of the FET. Using the source and/or drain structures of the transistor as seed surfaces provide advantageous fabrication options, e.g. in terms of interconnection to the second semiconductor device. Furthermore, it can be advantageously used with raised source and drain layers which provide easy access to their surfaces.

According to another embodiment, the starting structure is a virtual substrate of the second semiconductor device. A virtual substrate may be defined as a substrate that serves as support/foundation/starting point for the subsequent formation of the second semiconductor device as opposed to the substrate as such which is a main/base substrate that supports both the first and the second semiconductor device.

According to an embodiment, the starting structure may serve as another seed surface for growing a semiconductor structure of the second semiconductor device. This is an elegant and simple way of providing a seed surface at the level of the second semiconductor device.

According to another embodiment, the first semiconductor device is formed in a Front End of Line (FEOL) process. Such embodiments may enable the integration of the second semiconductor devices, e.g. III-V semiconductor devices, on pre-processed structures, e.g. pre-processed wafers comprising the first semiconductor devices. The pre-processed devices may be e.g. already fabricated Si/SiGe circuits, thus enabling hybrid circuits.

According to a further embodiment, fabricating the first semiconductor device comprises a first set of lithography and etching steps and fabricating the second semiconductor device comprises a second set of lithography and etching steps. This facilitates co-integration of hybrid circuits.

According to an embodiment, a part of the filling structure may be formed as electrical interconnect between the first semiconductor device and the second semiconductor device. This eases fabrication, e.g. by avoiding patterning and etching of additional holes.

According to a further embodiment, the method comprises growing in a first growth step in the cavity structure a first filling structure comprising a third semiconductor material different from the first and the second semiconductor materials; growing in a second growth step a second filling structure comprising the second semiconductor material; forming the semiconductor starting structure from the second filling structure; fabricating the second semiconductor device comprising the starting structure and selectively etching the first filling structure. Thereby the third semiconductor material is removed and an interconnect cavity structure is formed. Then the interconnect cavity structure is filled with an electrically conducting material. As a result, an electrically conducting connection between the first and the second semiconductor device is formed. This is an efficient and elegant way to provide high quality interconnects between the first and the second semiconductor devices.

According to another embodiment, the method comprises growing in a first growth step by in situ doping a first filling structure comprising a doped semiconductor material and growing in a second growth step a second filling structure comprising the second semiconductor material. Thereby via the first filling structure an electrically conducting connection is created between the first and the second semiconductor device. With such an approach, an electrical connection is already provided before the starting structure is formed. This is an efficient and simple way to provide electrical interconnects between the first and the second semiconductor device that avoids subsequent formation of electrical interconnect structures.

According to a further embodiment, the growing of the filling structure is performed by metal organic chemical vapor deposition (MOCVD); atmospheric pressure CVD; low or reduced pressure CVD; ultra-high vacuum CVD; molecular beam epitaxy (MBE); atomic layer deposition (ALD) or hydride vapor phase epitaxy. Such methods are well established and allow a precise and reliable control of the growth.

Embodiments of the invention may facilitate co-integration of hybrid circuits, e.g. $Si_xGe_{1-x}$ semiconductor devices with group III-V compound semiconductor devices. This is a promising approach for achieving sub-10 nm geometry devices. According to one embodiment, the first semiconductor devices are embodied as digital devices and the second semiconductor devices are embodied as analog/RF devices.

According to embodiments, the first semiconductor material is comprised of $SixGe_{1-x}$ where x=0 to 1. According to further embodiments, the second semiconductor material is comprised of a group compound material. The starting structure may be, according to an embodiment, an active layer of the second semiconductor device. According to another embodiment, the starting structure may be a virtual substrate of the second semiconductor device. The first semiconductor device may be embodied as a Field Effect Transistor (FET) and the seed surface may be a source and/or drain surface of the FET of the first semiconductor device. According to an embodiment, the second semiconductor device may also be a Field Effect Transistor (FET) and the starting structure may be a channel structure of the FET of the second semiconductor device.

The growth channel may comprise, according to an embodiment, an interconnect structure of metal serving as electrical interconnect between the first semiconductor device and the second semiconductor device.

According to a further embodiment, the growth channel comprises an interconnect structure of a doped semiconductor material grown from the seed surface of the first semiconductor device, the interconnect structure serving as electrical interconnect between the first semiconductor device and the second semiconductor device.

A further aspect concerns a wafer comprising a plurality of semiconductor circuits as claimed in the previous aspect.

According to another aspect, a semiconductor circuit is obtained by methods according to embodiments of the first aspect.

The steps of the different aspects may be performed in different orders.

Furthermore, the steps may also be combined, i.e. that e.g. two or more steps may be performed together.

Advantages of the features of one aspect may apply to corresponding features of another aspect.

FIGS. 1-10 show successive stages of a method for fabricating hybrid semiconductor circuits comprising semiconductor devices with different semiconductor materials.

FIGS. 1-10 and the other Figures subsequently described below generally show enlarged cross-sectional views of initial, intermediate and final structures formed during the stages of the method. In any or all of the figures the dimensions may not be drawn to scale and may be shown in a simplified and schematic way to illustrate the features and principles of embodiments of the invention.

FIG. 1 illustrates a cross-sectional view of an initial structure 100. The initial structure 100 comprises a substrate 110. The substrate 110 may be e.g. a bulk semiconductor substrate, a substrate comprising an insulating layer such as a silicon on insulator (SOT) substrate or a hybrid substrate. The substrate 110 may be embodied as a crystalline semiconductor or a compound semiconductor wafer of a large diameter. The substrate may comprise, for example, a material from group IV of the periodic table. Materials of group IV include, for example, silicon, germanium, mixed silicon and germanium, mixed silicon and carbon, mixed silicon germanium and carbon and the like. For example, the substrate 110 may be a crystalline silicon wafer that is used in the semiconductor industry.

On the substrate 110 an insulating layer 111 is provided. The insulating layer 111 may be embodied e.g. as a dielectric layer. According to embodiments the insulating layer 111 may be a buried oxide (BOX) layer. The insulating layer 111 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof.

The thicknesses of the substrate 110 and the insulating layer 111 can be any suitable thicknesses. On the insulating layer 111 a first semiconductor device 120 has been formed. According to this embodiment the first semiconductor device 120 is a field effect transistor (FET) 120. The FET 120 comprises a channel structure 121 disposed on the insulating layer 111. The channel structure 121 comprises a first semiconductor material. The first semiconductor material may be embodied e.g. as $Si_xGe_{1-x}$, where x=0 to 1. In other words, the first semiconductor material may be embodied as Silicon (Si), Germanium (Ge) or a SiGe alloy. In the following, references to SiGe shall be understood as references to $Si_xGe_{1-x}$ where x=0 to 1. The channel structure 120 may have a thickness of, for example, about 5 nm that corresponds to a desired channel thickness of the FET 120.

On the channel structure 121 there is disposed a gate stack 130 of the FET 120. The gate stack 130 comprises a gate dielectric layer 131, a gate metal layer 132 and a gate cap layer 133. The gate dielectric layer 131 may be embodied as high-k layer. A high k-dielectric layer is a layer comprising a dielectric material having a higher dielectric constant k than $SiO_2$. $SiO_2$ has a dielectric constant k of 3.9 and accordingly dielectric materials having a dielectric constant k of more than 3.9 are denoted as high-k materials. The gate dielectric layer 131 may be embodied e.g. as a layer comprising $HfO_2$, HfON, HfSiON, $ZrO_2$, ZrON, $LaO_3$, La—Al—O, La—Lu—O, SiN or SiON.

The gate metal layer 132 may be embodied e.g. as a layer of Ti, Hf, TiN, W, Al or poly-silicon. The gate cap layer 133 may be embodied e.g. as a layer comprising SiN or derivatives thereof or as a layer comprising $SiO_2$. On sidewalls of the gate stack 130, insulating spacers 135 have been formed that insulate the gate stack 130 from a raised source layer 125 and a raised drain layer 126. The raised source layer 125 and the raised drain layer 126 may be formed on the channel structure 121 by selective epitaxy. The raised source layer 125 and the raised drain layer 126 comprises also the first semiconductor material and may hence be embodied as $Si_xGe_{1-x}$, where x=0 to 1. According to embodiments, the ratio x of Si in the SiGe alloy of the source layer 125 and the drain layer 126 may be different from the ratio x of Si in the SiGe alloy of the channel structure 121. Such a different ratio may induce strain in the channel structure 121 which results in a compressed channel structure 121 and an improved device performance. The source layer 125 and the drain layer 126 may be doped with a p-type dopant, e.g. with boron (B). The doping can be performed by in-situ doping during the selective epitaxy step.

In general, the formation of the structure 100 may be performed by methods well known in the art including e.g. atomic layer deposition (ALD), chemical vapor deposition (CVD) methods, lithography and etching.

Figure 2:
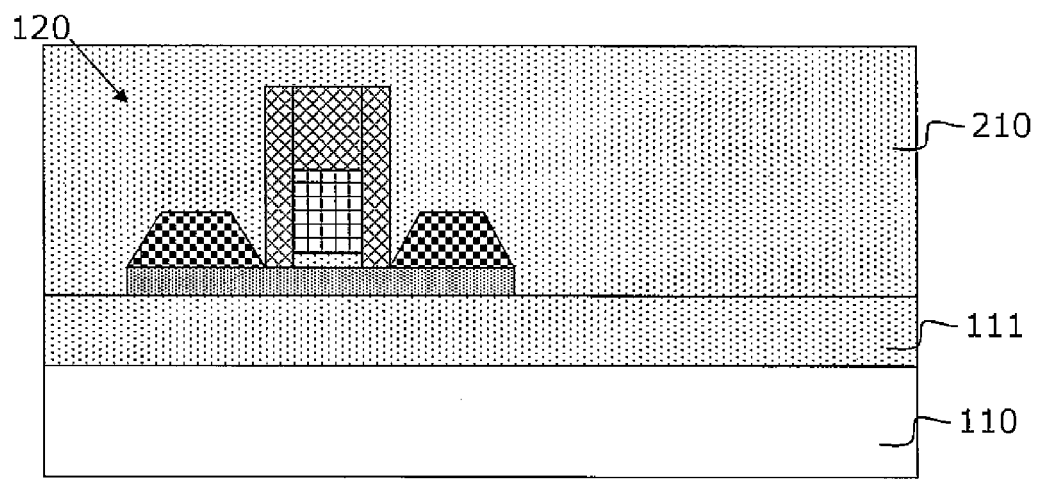

FIG. 2 shows a cross-sectional view of a structure 200 after an insulating layer 210 has been deposited and planarized as interlayer dielectric on the first semiconductor device 120 and the insulating layer 111.

The insulating layer 210 can be formed by methods well known in the art, as for example chemical vapor deposition (CVD), plasma enhanced CVD (PECVD), chemical solution deposition, MOCVD, evaporation, sputtering and other suitable deposition processes. The insulating layer 210 may comprise dielectric material including, but not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof. After the deposition the surface of the insulating layer 210 may be planarized by Chemical Mechanical Polishing (CMP).

Figure 3:
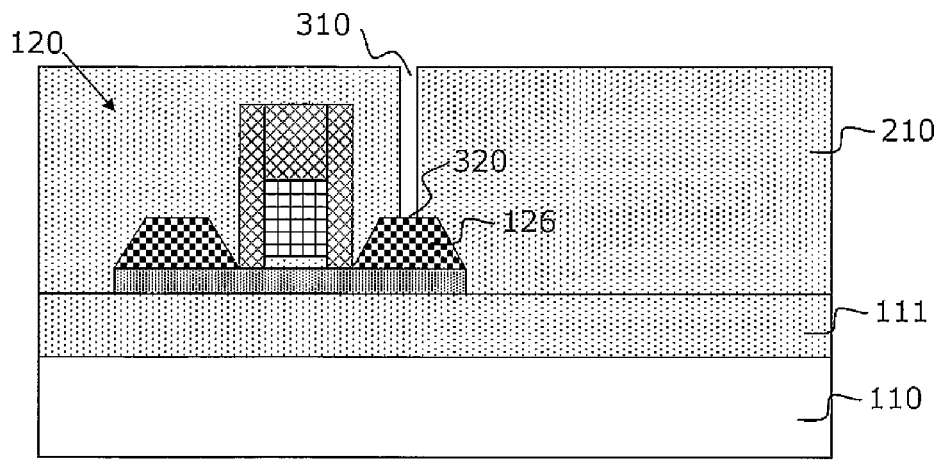

FIG. 3 shows a cross-sectional view of a structure 300 after a contact hole/channel 310 has been formed in the insulating layer 210. The contact hole/channel 310 extends from the top surface of the insulating layer 210 to the top surface 320 of the drain layer 126 of the FET 120. For example, a combination of lithography and dry-etching techniques well known in the art can be used to fabricate the contact hole/channel 310.

Figure 4:
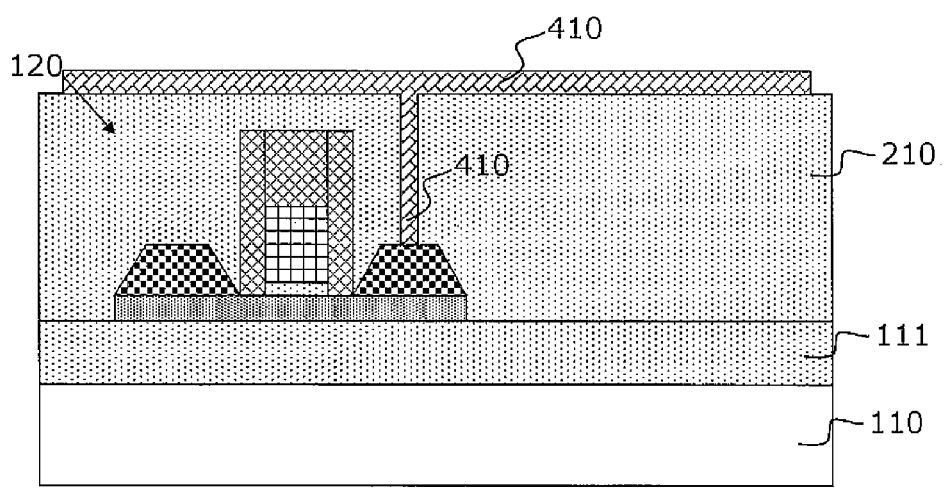

FIG. 4 shows a cross-sectional view of a structure 400 after the deposition of a sacrificial material, thereby forming a sacrificial structure 410 in the contact hole/channel 310 and on the surface of the insulating layer 210. The deposition of the sacrificial structure 410 may include sub-steps of filling the hole/channel 310 in a first sub-step with the sacrificial material, then treating in a second sub-step the surface of the excess material deposited on the surface of the insulating layer 210 by CMP, then depositing in a third sub-step the sacrificial structure 410 on the surface of the insulating layer 210 and treating in a fourth sub-step the sacrificial structure 410 by CMP.

FIG. 5 shows a cross-sectional view of a structure 500 after the sacrificial structure 410 has been patterned and etched, thereby forming a sacrificial structure 511. This can be done by any suitable lithography and etching techniques, such as photolithography or electron beam lithography combined with dry or wet etching. The sacrificial structure 511 establishes a negative mold for a cavity structure to be formed subsequently. The sacrificial structure 511 may comprise e.g. amorphous silicon as sacrificial material, but one may also use polymers or other suitable materials that can be removed easily in a subsequent step.

FIG. 6 shows a cross-sectional view of a structure 600 after another insulating layer 610 has been deposited as another interlayer dielectric on the sacrificial structure 511. The insulating layer 610 can be formed by methods well known in the art as described with reference to FIG. 2. The insulating layer 610 is generally formed of the same material as the insulating layer 210.

Figure 7:
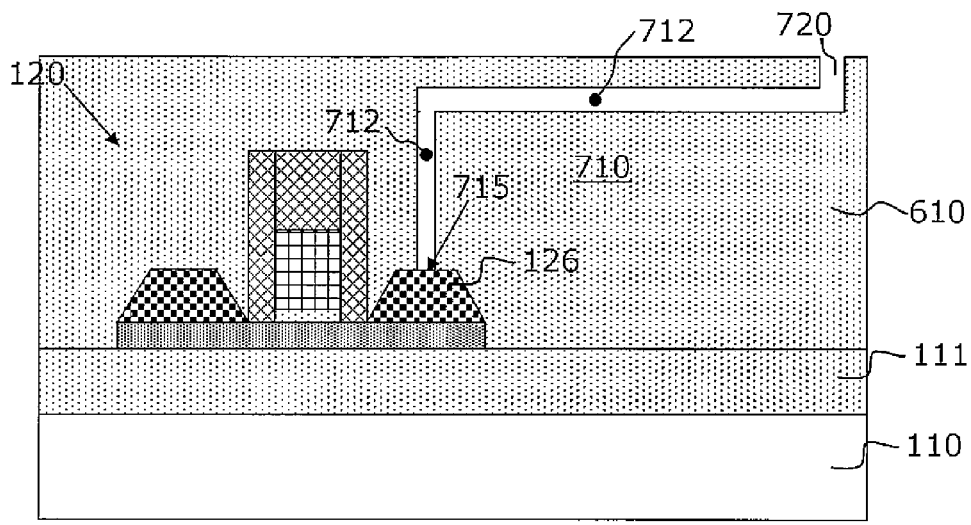

FIG. 7 shows a cross-sectional view of a structure 700 after the removal of the sacrificial structure 511. The removal can be done, for example, by suitable etching techniques. The suitable etching technique may depend on the material used as sacrificial material. There are, for example, etching techniques available that selectively remove amorphous silicon as sacrificial material. As a result, a cavity structure 710 has been formed on the first semiconductor device 120, i.e. the FET 120 according to this embodiment. The cavity structure 710 comprises a growth channel 712 which connects a crystalline seed surface 715 of the first semiconductor device 120 with an opening 720 of the cavity structure 710. The crystalline seed surface 715 is in this example the top surface of the raised drain layer 126 of the FET 120.

Figure 8:
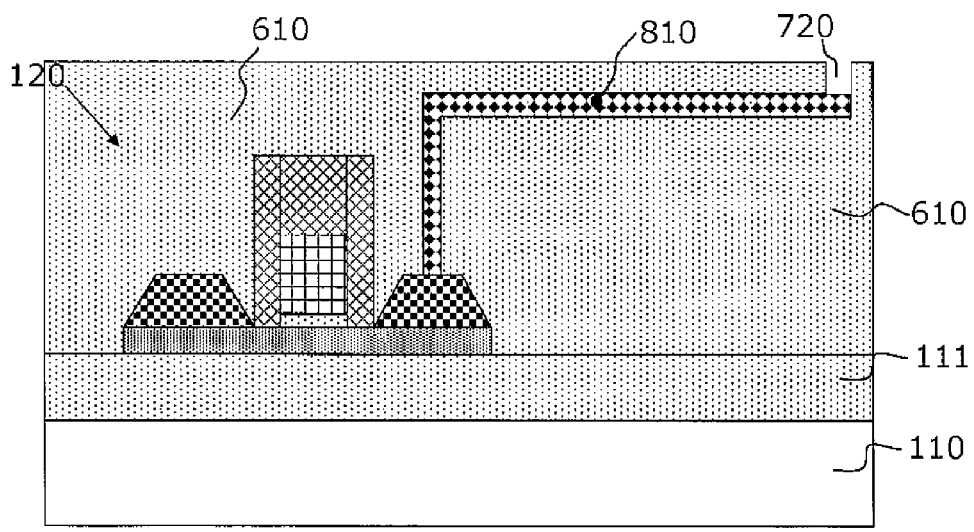

FIG. 8 shows a cross-sectional view of a structure 800 after growing via the opening 720 from the seed surface 715 a semiconductor filling structure 810 in the growth channel 712. The semiconductor filling structure 810 comprises or consists of a second semiconductor material different from the first semiconductor material. The growth of the semiconductor filling structure 810 may be performed in particular by selective epitaxy in any suitable deposition system. For example, metal organic chemical vapor deposition (MOCVD), atmospheric pressure CVD, low or reduced pressure CVD, ultra-high vacuum CVD, or atomic layer deposition (ALD) techniques can be employed.

The second semiconductor material may be generally any material suitable for epitaxial growth. According to embodiments, the second semiconductor material may be a group III-V compound semiconductor material. The group III-V material could be a binary material such, as for example, Gallium Arsenide (GaAs) or Gallium Antimonide (GaSb). The group III-V material could also be a tertiary material such as, for example, Indium Gallium Arsenide (InGaAs) or Indium Gallium Antimonide (InGaSb). According to other embodiments group II-VI semiconductor compounds, mixed II-VI compounds, and IV-VI compounds may be used. According to another embodiment $In_xGa_{1-x}As$ where x=0 to 1 may be used. According to other embodiments further alloyed combinations of (In, Ga) and (As, Sb, P) may be used. Further examples include gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe) and the like.

Figure 9:
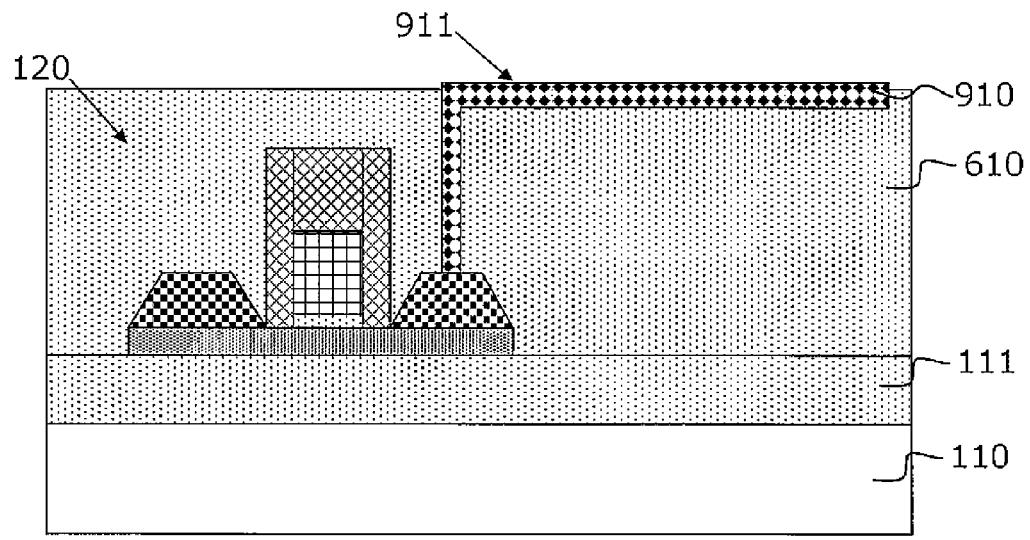

FIG. 9 shows a cross-sectional view of a structure 900 after a semiconductor starting structure 910 has been formed. Forming the semiconductor starting structure 910 includes removing a part of the insulating layer 610 to release a surface 911 of the starting structure 910. The semiconductor starting structure 910 can be formed e.g. by lithography and etching or by CMP.

Figure 10:
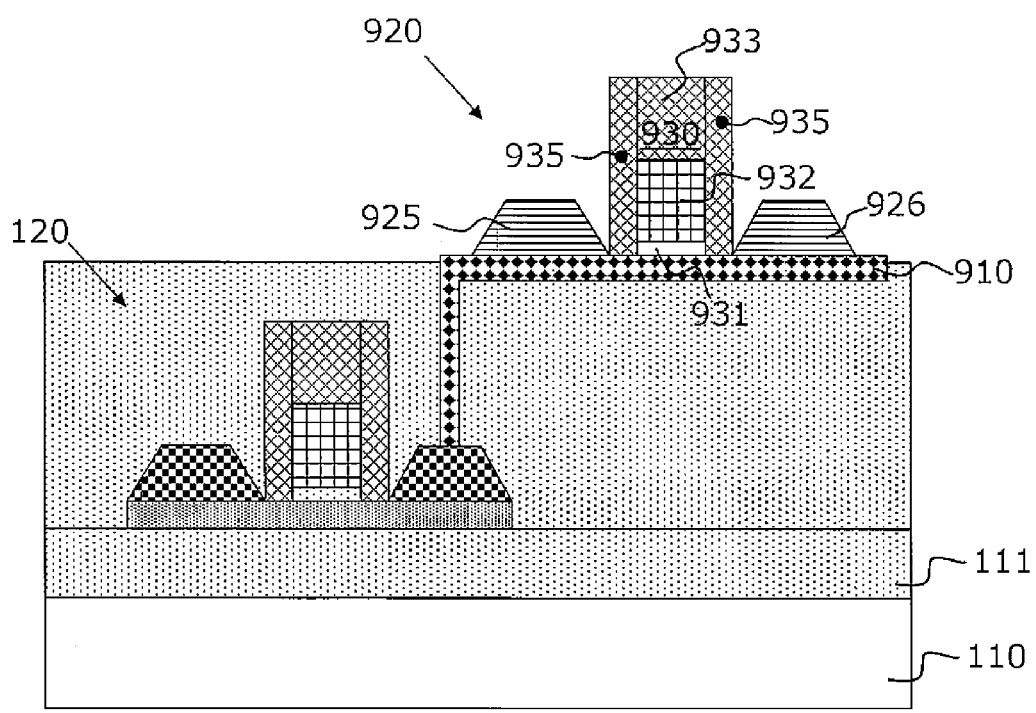

FIG. 10 shows a structure 1000 in a cross-sectional view after the fabrication of a second semiconductor device 920 on the starting structure 910. According to this embodiment the second semiconductor device 920 is a field effect transistor (FET) 920 and the starting structure 910 is a channel structure 910 of the FET 920. The channel structure 910 may have a thickness of, for example, about 5 nm that corresponds to a desired channel thickness of the FET 920. On the channel structure 910 there is disposed a gate stack 930 of the FET 920. The gate stack 930 comprises a gate dielectric layer 931, a gate metal layer 932 and a gate cap layer 933. The gate dielectric layer 931 may be embodied e.g. as layer comprising $HfO_2$, HfON, HfSiON, $ZrO_2$, ZrON, $LaO_3$, La—Al—O, La—Lu—O, SiN or SiON. The gate metal layer 932 may be embodied e.g. as a layer of Ti, Hf, TiN, W, Al or poly-silicon. The gate cap layer 933 may be embodied e.g. as a layer comprising SiN or derivatives thereof or as a layer comprising $SiO_2$.

On sidewalls of the gate stack 930 insulating spacers 935 have been formed that insulate the gate stack 930 from a raised source layer 925 and a raised drain layer 926. The raised source layer 925 and the raised drain layer 926 may be formed on the channel structure 910 by selective epitaxy. The raised source layer 925 and the raised drain layer 926 comprises the second semiconductor material and may hence be embodied as group III-V material or other suitable materials as mentioned above. The source layer 925 and the drain layer 926 may be doped with a n-type dopant, e.g. with Si, Sn, Se, Te or Ge. The doping can be performed by in-situ doping during the selective epitaxy step.

FIGS. 11-16 show successive stages of a method for fabricating a hybrid integrated photonic device according to an embodiment of the invention.

FIG. 11 illustrates a cross-sectional view of a first semiconductor device 1100. The first semiconductor device 1100 is a waveguide structure comprising a substrate 1110, e.g. a Si-substrate, and an insulating layer 1111 of e.g. $SiO_2$. The first semiconductor device comprises furthermore a waveguide 1120, e.g. a Si-waveguide, and reflectors 1125, e.g. Si-reflectors. The first semiconductor device 1100 is used as a starting point to grow another second semiconductor device on top of it as will be explained in the following.

FIG. 12 shows a cross-sectional view of a structure 1200 after a cavity structure 1210 has been formed on the first semiconductor device 1100. The cavity structure 1210 comprises a growth channel 1212 which connects a crystalline seed surface 1215 of the first semiconductor device 1100 with an opening 1220 of the cavity structure 1210. The crystalline seed surface 1215 is in this example the surface of the Si-waveguide 1120. The cavity structure 1210 may be formed in a corresponding way as described above with reference to FIGS. 2-7.

Figure 13:
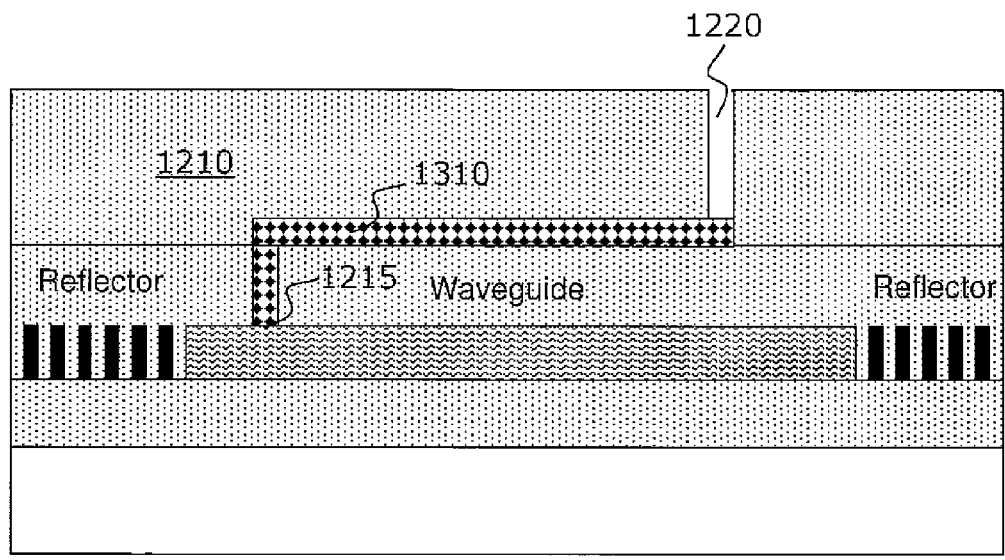

FIG. 13 shows as structure 1300 a cross-sectional view of the structure of FIG. 12 after growing via the opening 1220 from the crystalline seed surface 1215 a semiconductor filling structure 1310 in the growth channel 1212. The semiconductor filling structure 1310 comprises or consists of a second semiconductor material different from the first semiconductor material. The growth of the semiconductor filling structure 1310 may be performed in particular by selective epitaxy in any suitable deposition system as described above. The second semiconductor material may be generally any material suitable for epitaxial growth. According to embodiments, the second semiconductor material may be a group III-V compound semiconductor material or any other suitable material mentioned above with reference to FIG. 8.

Figure 14:
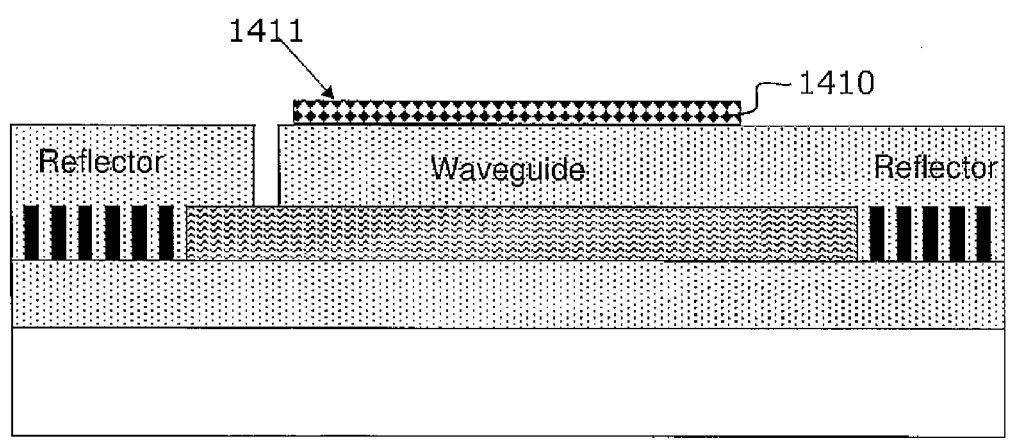

FIG. 14 shows a cross-sectional view of a structure 1400 after a semiconductor starting structure 1410 has been formed from the semiconductor filling structure 1310. Forming the semiconductor starting structure 1410 includes removing a part of the cavity structure 1210 to release a surface 1411 of the starting structure 1410. The semiconductor starting structure 1410 can be formed from the structure 1300 e.g. by lithography and etching or by CMP.

Figure 15:
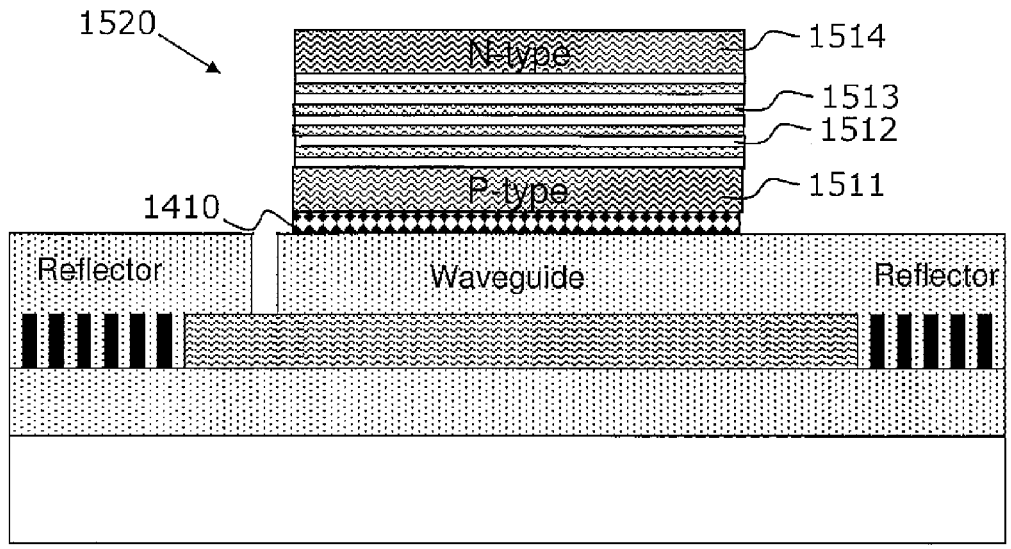

FIG. 15 shows a cross-sectional view of a structure 1500 after the fabrication of a second semiconductor device 1520 on the starting structure 1410. According to this embodiment the second semiconductor device 1520 is a III-V laser 1520 that is grown on the starting structure 1410. The starting structure 1410 serves as virtual substrate for the III-V laser 1520. The laser 1520 comprises a stack of layers of different III-V materials. According to one embodiment the III-V laser may be stacked as follows. The starting structure 1410 comprises a first III-V material. On top of the starting structure 1410 a p-doped layer 1511 of a second III-V material is grown. On top of the p-doped layer 1511 layers 1512 of a third material and layers 1513 of a fourth III-V material are grown in an alternating way. On top of the stack an n-doped layer 1514 of the second III-V material is grown. The resulting layer stack forms a quantum well structure.

Figure 16:
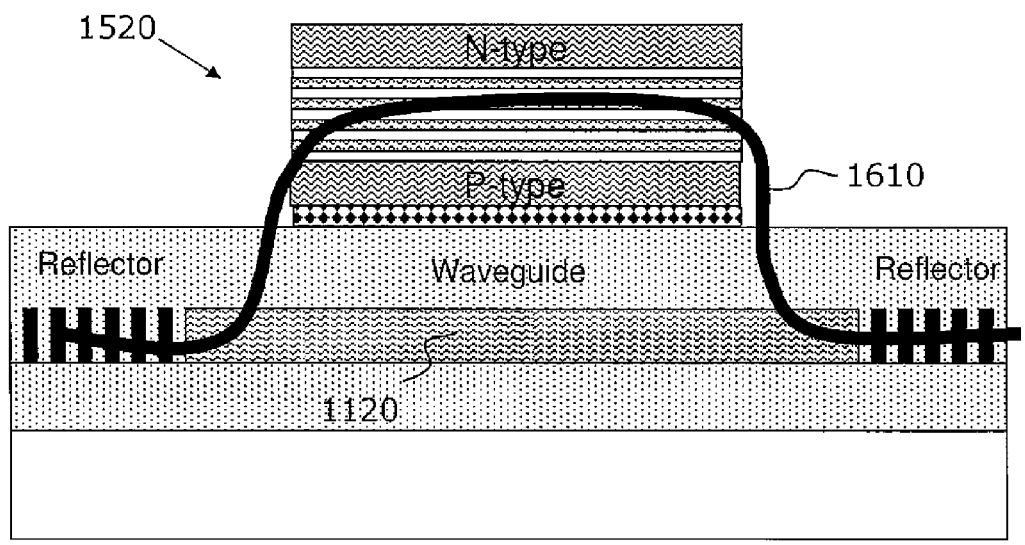

FIG. 16 shows a cross-sectional view of a structure 1600 illustrating how light 1610 is coupled between the waveguide 1120 and the III-V laser 1520.

FIGS. 17-20 illustrate exemplary embodiments of electrical interconnect structures for the first and the second semiconductor devices.

FIG. 17 shows a cross-sectional view of a structure 1700 corresponding to the structure of FIG. 10 and illustrating how a part of the filling structure may be formed as interconnect structure between the first semiconductor device 120 and the second semiconductor device 920. Generally the second semiconductor material that has been grown in the growth channel 712 of the cavity structure 710 may be used as electrical interconnect structure between the first and the second semiconductor device. According to the embodiment shown in FIG. 17 in a first growth step a first filling structure 1710 has been grown. The first filling structure 1710 comprises the second semiconductor material in doped form. The doping can be performed by in situ doping. Then in a second growth step a second filling structure 1711 has been grown. The second filling structure 1711 comprises the second semiconductor material in undoped or doped form and corresponds to the channel structure of the second FET 920. The first filling structure 1711 establishes an electrically conducting connection between the first FET 120 and the second FET 920. The length of the first filling structure 1710 may be controlled e.g. by the time the in situ doping is performed during the growth of the second semiconductor material. While the doping increases the electrical conductivity of the interconnect structure and may therefore be beneficial, according to other embodiments the interconnect structure may also be formed by the second semiconductor material in an undoped form.

FIG. 18 shows a cross-sectional view of a structure 1800 which comprises a first filling structure 1810 of a third semiconductor material that was grown in a first growth step in the cavity structure 710. The third semiconductor material is different from the second semiconductor material and the first semiconductor material. The third semiconductor material may be embodied as a group III-V material. In a second growth step a second filling structure 1811 has been formed that comprises the second semiconductor material. The second semiconductor material may be e.g. a group III-V material which is different from the group III-V material of the first filling structure 1810. The second filling structure 1811 is the channel/starting structure for the second FET 920.

Figure 19:
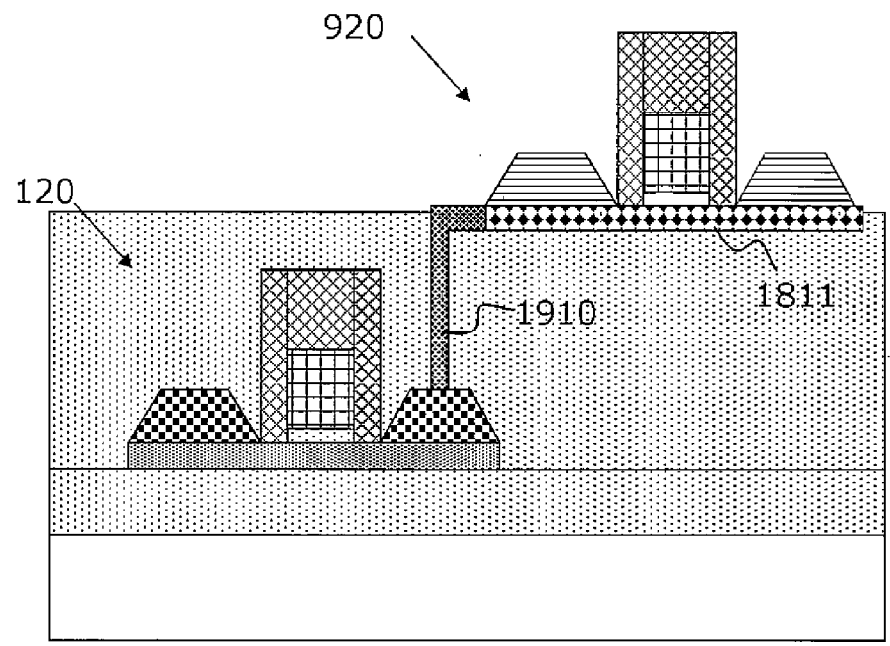

FIG. 19 shows a cross-sectional view of a structure 1900 which was fabricated subsequently from the structure 1800 of FIG. 18. It comprises, instead of the first filling structure 1810 of the third semiconductor material, an interconnect structure 1910 of metal. In order to replace the first filling structure 1810 of the third semiconductor material with a metal structure, the first filling structure 1810 has been selectively removed from the cavity structure 710, e.g. by a suitable selective etching process that only etches the third semiconductor material, but not the second and the first semiconductor material. This creates an empty cavity structure (not shown) that can then be subsequently filled with the metal to form the interconnect structure 1910. For the filling with the metal ALD-techniques may be used.

Figure 20:
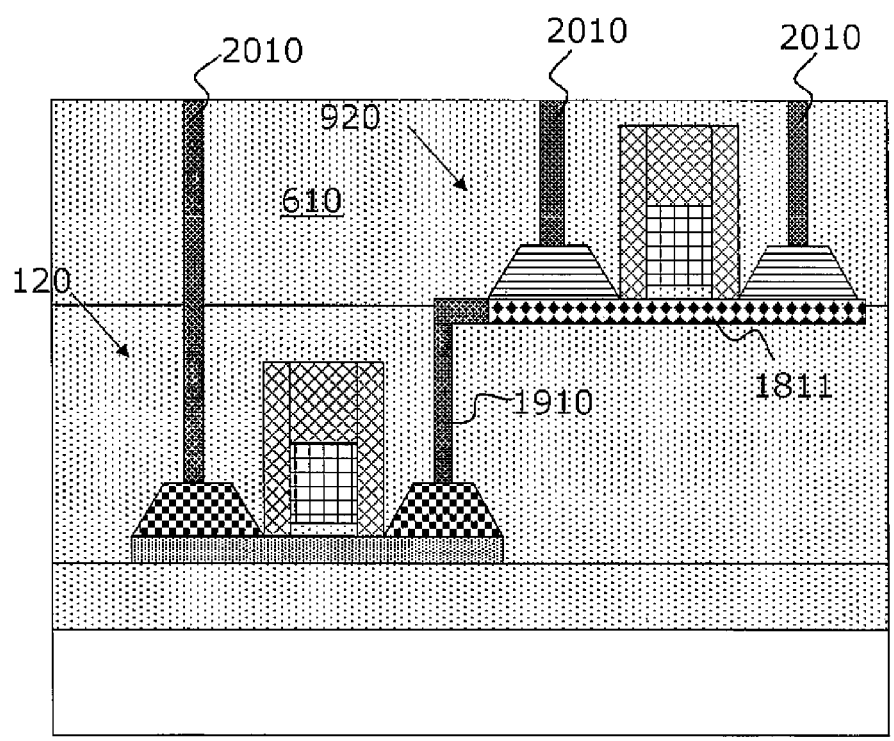

FIG. 20 shows a cross-sectional view of a structure 2000 that comprises in addition to the interconnect structure 1910 further contact structures 2010 that provide drain/source contacts for the first FET 120 and the second FET 920. The contact structures 2010 contact the source/drains from the top. For this, in a first step corresponding holes or trenches extending to the top surface of the raised source/drain layers may be formed in the insulating layer, e.g. by lithography and etching. Then in a subsequent step the holes/trenches may be filled with metal, e.g. by ALD.

As can be seen in FIG. 20, embodiments of the invention provide two different types of interconnect structures. The interconnect structure 1910 may be regarded as a new type of interconnect structure that connects the first semiconductor device 120 and the second semiconductor device 920 "internally" within the insulating layer 610 via the filled growth channels. On the contrary, the contact structures 2010 may be considered as conventional structures that contact the first FET 120 and the second FET 920 from the top of the insulating layer 610.

While illustrative examples are given above, it will be appreciated that the basic fabrication steps described above can be used to produce semiconductor circuits of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the filling structure may in some embodiment be provided by a surface region of an amorphous or polycrystalline semiconductor of the first semiconductor device or a metal or metal-semiconductor alloy such as a metal silicide. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline but its crystal orientation will be random.

By appropriate shaping of the growth channel of the cavity structure in fabrication processes embodying the invention, filling structures can be formed with any desired shapes and cross-sectional dimensions. Furthermore, the cross-section may be varied along the length of the growth channel if desired. For example, filling structures can be formed with curves, bends, corners, junctions and branches by appropriately shaping the cavity structure. In particular, interconnect structure may be provided with turns of various angles, e.g. 90°, to pack the first and the second semiconductor devices in a dense manner. Furthermore, defects may be reduced by appropriate bends/corners.

By fabrication methods according to embodiments of the invention group III-V FETs may be fabricated alongside pre-existing Si or SiGe FET, thereby creating 2-dimensional hybrid circuits. Furthermore, group III-V FETs in 3-dimensional monolithic schemes may be formed on pre-existing Si/SiGe/Ge FETs or devices, thereby creating 3D circuit. Furthermore, III-V photonic structures may be formed in a 3D monolithic scheme on Si photonic/electronic front ends. In addition, 3D interconnect structures between the first and the second semiconductor devices may be formed.

The disclosed semiconductor devices and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip may be integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input devices, and a central processor.

Embodiments of the invention may allow new distribution and fabrication models for integrated semiconductor circuits. As an example, a first company may provide the digital part of a hybrid circuit and fabricate and distribute wafers comprising a plurality of first semiconductor devices of e.g. SiGe. A second company specialized e.g. in analog/RF circuits may purchase these pre-fabricated wafers and fabricate analog/RF circuits on top of this pre-fabricated wafer by using the techniques as described above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor circuit comprising:
   providing a semiconductor substrate;
   fabricating a first semiconductor device comprising a first semiconductor material on the substrate;
   forming an insulating layer comprising a cavity structure on the first semiconductor device, the cavity structure comprising at least one growth channel, the growth channel connecting a seed surface of the first semiconductor device with an opening;

growing via the opening from the seed surface a semiconductor filling structure comprising a second semiconductor material different from the first semiconductor material in the growth channel;

forming a semiconductor starting structure for a second semiconductor device from the filling structure; and fabricating a second semiconductor device comprising the semiconductor starting structure.

2. A method as claimed in claim 1, wherein the first semiconductor material is comprised of $Si_xGe_{1-x}$ where x=0 to 1.

3. A method as claimed in claim 1, wherein the second semiconductor material is comprised of a group III-V compound material.

4. A method as claimed in claim 1, wherein the semiconductor starting structure is an active layer of the second semiconductor device.

5. A method as claimed in claim 1, wherein the semiconductor starting structure is a virtual substrate of the second semiconductor device.

6. A method as claimed in claim 1, wherein the semiconductor starting structure serves as another seed surface for growing a semiconductor structure of the second semiconductor device.

7. A method as claimed in claim 1, wherein the first semiconductor device is a Field Effect Transistor (FET) and the seed surface is a source and/or drain surface of the FET.

8. A method as claimed in claim 1, wherein the second semiconductor device is a Field Effect Transistor (FET) and the semiconductor starting structure is a channel structure of the FET.

9. A method as claimed in claim 1, wherein the first semiconductor device is formed in a Front End of Line (FEOL) process.

10. A method as claimed in claim 1, wherein fabricating the first semiconductor device comprises a first set of lithography and etching steps and fabricating the second semiconductor device comprises a second set of lithography and etching steps.

11. A method as claimed in claim 1, comprising forming a part of the semiconductor filling structure as electrical interconnect between the first semiconductor device and the second semiconductor device.

12. A method as claimed in claim 1, comprising:

growing in a first growth step in the cavity structure a first filling structure comprising a third semiconductor material different from the first and the second semiconductor material;

growing in a second growth step a second filling structure comprising the second semiconductor material;

forming the semiconductor starting structure from the second filling structure;

fabricating the second semiconductor device comprising the semiconductor starting structure;

selectively etching the first filling structure, thereby removing the third semiconductor material and creating an interconnect cavity structure;

filling the interconnect cavity structure with an electrically conducting material, thereby creating an electrically conducting connection between the first and the second semiconductor device.

13. A method as claimed in claim 1, comprising:

growing in a first growth step by in situ doping a first filling structure comprising a doped semiconductor material;

growing in a second growth step a second filling structure comprising the second semiconductor material, thereby creating via the first filling structure an electrically conducting connection between the first and the second semiconductor device.

14. A method as claimed in claim 1, wherein the growing of the filling structure is performed by one of: metal organic chemical vapor deposition (MOCVD); atmospheric pressure CVD; low or reduced pressure CVD; ultra-high vacuum CVD; molecular beam epitaxy (MBE); atomic layer deposition (ALD) and hydride vapor phase epitaxy.

15. A semiconductor circuit comprising:

a semiconductor substrate;

a first semiconductor device comprising a first semiconductor material;

a second semiconductor device comprising a second semiconductor material different from the first semiconductor material;

an insulating layer between the first semiconductor device and the second semiconductor device, the insulating layer comprising a cavity structure having at least one growth channel, the growth channel connecting a crystalline seed surface of the first semiconductor device with a starting structure of the second semiconductor device, the starting structure comprising the second semiconductor material and being epitaxially grown from the crystalline seed surface of the first semiconductor device.

16. A circuit as claimed in claim 15, wherein the first semiconductor material is comprised of $Si_xGe_{1-x}$ where x=0 to 1.

17. A circuit as claimed in claim 15, wherein the second semiconductor material is comprised of a group III-V compound material.

18. A circuit as claimed in claim 15, wherein the starting structure is an active layer of the second semiconductor device.

19. A circuit as claimed in claim 15, wherein the starting structure is a virtual substrate of the second semiconductor device.

20. A circuit as claimed in claim 15, wherein the first semiconductor device is a Field Effect Transistor (FET) and the crystalline seed surface is a source and/or drain surface of the FET of the first semiconductor device.

21. A circuit as claimed in claim 15, wherein the second semiconductor device is a Field Effect Transistor (FET) and the starting structure is a channel structure of the FET of the second semiconductor device.

22. A circuit as claimed in claim 15, wherein the growth channel comprises an interconnect structure of metal serving as electrical interconnect between the first semiconductor device and the second semiconductor device.

23. A circuit as claimed in claimed in claim 15, wherein the growth channel comprises an interconnect structure of a doped semiconductor material grown from the crystalline seed surface of the first semiconductor device, the interconnect structure serving as electrical interconnect between the first semiconductor device and the second semiconductor device.

24. A wafer comprising a plurality of semiconductor circuits as claimed in claim 15.

* * * * *